(12) United States Patent
Paul

(10) Patent No.: US 10,069,284 B1
(45) Date of Patent: Sep. 4, 2018

(54) IRRIGATION CONTROL BOX WITH OFFSET HINGE ASSEMBLY

(71) Applicant: Hunter Industries, Inc., San Marcos, CA (US)

(72) Inventor: Michael F. Paul, San Diego, CA (US)

(73) Assignee: Hunter Industries, Inc., San Marcos, CA (US)

(*) Notice: Subject to any disclaimer, the term of this patent is extended or adjusted under 35 U.S.C. 154(b) by 0 days.

(21) Appl. No.: 15/663,505

(22) Filed: Jul. 28, 2017

(51) Int. Cl.
*H02B 1/44* (2006.01)
*A01G 25/16* (2006.01)
*H02B 1/38* (2006.01)

(52) U.S. Cl.
CPC ............ *H02B 1/44* (2013.01); *A01G 25/165* (2013.01); *H02B 1/38* (2013.01)

(58) Field of Classification Search
CPC .......... H02B 1/44; H02B 1/38; A01G 25/165; A02G 25/165; H02G 3/185; H02G 3/088
USPC ..................................................... 174/50, 66
See application file for complete search history.

(56) References Cited

U.S. PATENT DOCUMENTS

| 831,801 | A | 9/1906 | Roberts |
|---|---|---|---|
| 2,041,850 | A | 5/1936 | Melick |
| 3,921,254 | A | 11/1975 | Foster, Jr. et al. |
| 3,981,599 | A | 9/1976 | Koen |
| 4,455,711 | A | 6/1984 | Anderson |
| 4,863,062 | A | 9/1989 | Holliday |
| 5,232,277 | A * | 8/1993 | Cassady ............... E05D 5/065 16/221 |
| 5,396,974 | A | 3/1995 | Pedlar |
| 5,398,868 | A | 3/1995 | Densen |
| 5,435,641 | A * | 7/1995 | Dupuis ............... H02B 1/40 109/59 R |
| 5,724,704 | A | 3/1998 | Seo |
| 6,233,784 | B1 | 5/2001 | Daoud |
| 7,090,095 | B2 | 8/2006 | Schafer |
| 7,520,481 | B2 | 4/2009 | Jopling |
| 2008/0250605 | A1 | 10/2008 | Park |
| 2014/0158394 | A1 | 6/2014 | Velasquez |

* cited by examiner

*Primary Examiner* — Dhirubhai R Patel
(74) *Attorney, Agent, or Firm* — Knobbe, Martens, Olson & Bear, LLP

(57) ABSTRACT

An irrigation control box can include a housing base having a first sidewall, a second sidewall, a top sidewall, a bottom sidewall, and a back wall. The box can include at least one hinge post. An offset hinge assembly can include a hinge assembly frame defining a hinge assembly interior, a first attachment structure positioned at least partially within the hinge assembly interior and configured to releasably attach to the at least one hinge post, and a rotational attachment point. A facepack can include at least one hinge point configured to mate with the rotational attachment point. In some cases, the facepack is configured to rotate about rotational attachment point of the offset hinge assembly with respect to the housing base when the housing base and facepack are each attached to the offset hinge assembly.

18 Claims, 24 Drawing Sheets

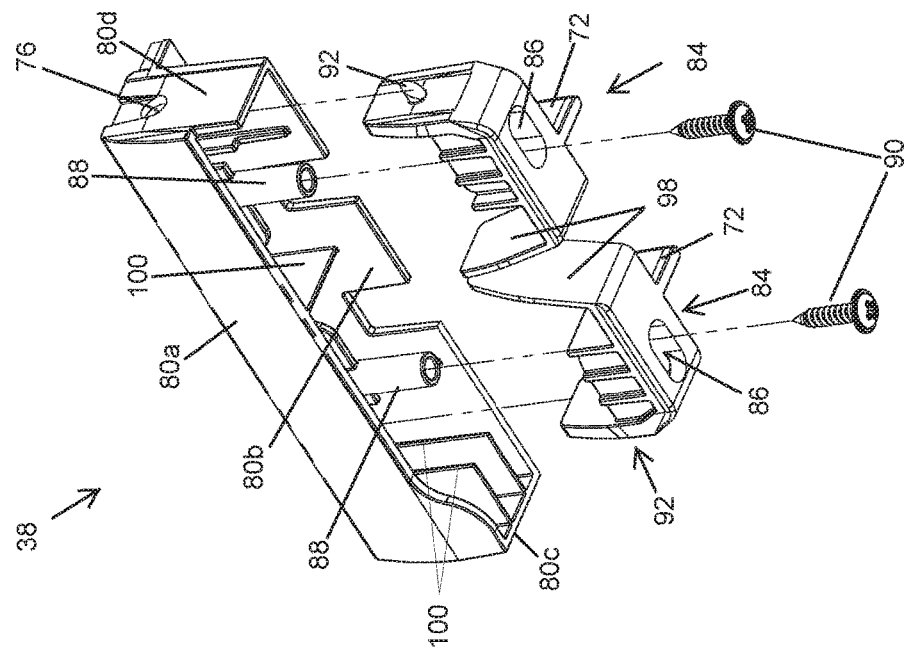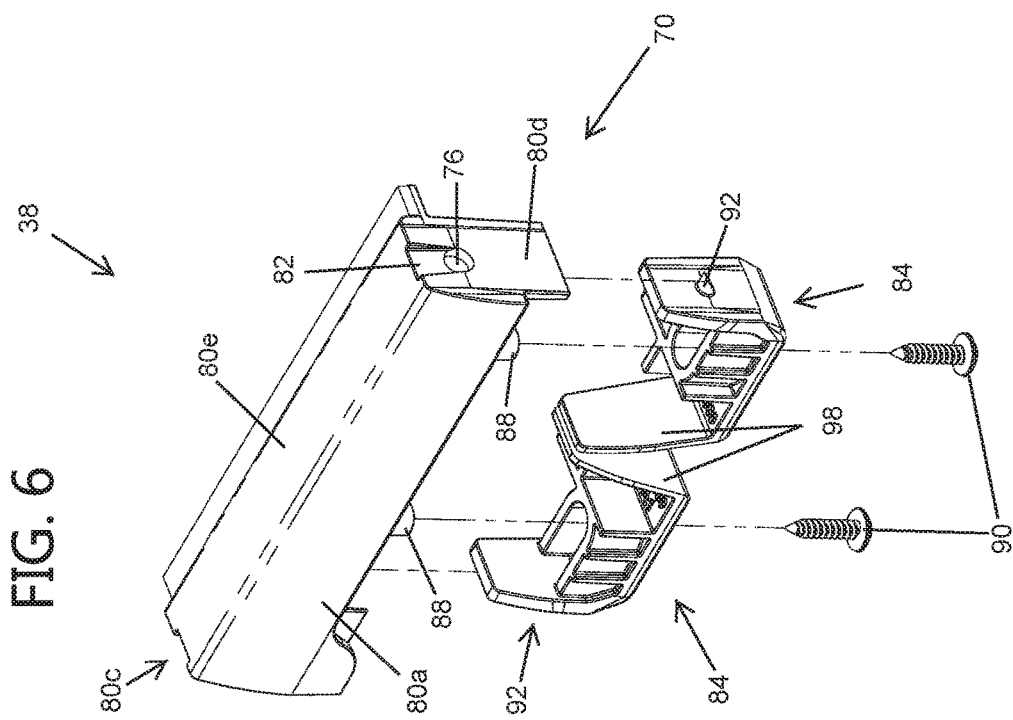

IRRIGATION CONTROL BOX WITH OFFSET HINGE ASSEMBLY

TECHNICAL FIELD

This application relates to irrigation control boxes.

DISCUSSION OF THE RELATED ART

Irrigation control boxes are used to control sprinklers, valves, and other irrigation devices in an irrigation system. The boxes can include many components such as a face pack, a micro controller, various operator inputs devices such as knobs, switches and buttons, a display, output terminals to connect to irrigation valves or relays, input terminals to connect to external sensors, and electronic circuitry to connect each of the components to their appropriate other component(s).

SUMMARY

An irrigation control box can include a housing base. The housing base can include: first sidewall; a second sidewall; a top sidewall extending between the first and second sidewalls; a bottom sidewall extending between the first and second sidewalls opposite the top wall; and/or a back wall connected to one or more of the first, second, top, and bottom sidewalls. The housing base can include a housing interior defined by the first, second, top, and bottom sidewalls. In some embodiments, the housing base includes at least one hinge post connected to at least one of the first sidewall, second sidewall, top sidewall, bottom sidewall, and back wall and extending away from the back wall. In some embodiments, the control box includes an offset hinge assembly. The offset hinge assembly can include a hinge assembly frame defining a hinge assembly interior. In some embodiments, the offset hinge assembly includes a first attachment structure positioned at least partially within the hinge assembly interior and configured to releasably attach to the at least one hinge post. The offset hinge assembly can include a rotational attachment point. In some embodiments, the irrigation control box includes a facepack comprising at least one hinge point configured to mate with the rotational attachment point. In some embodiments, the facepack is configured to rotate about rotational attachment point of the offset hinge assembly with respect to the housing base when the housing base and facepack are each attached to the offset hinge assembly.

In some embodiments, the offset hinge assembly includes a first hinge module positioned at least partially within the hinge assembly frame, the first hinge module including a first biasing portion and the first attachment structure, wherein the first biasing portion is configured to bias the first attachment structure to a first position in which the first attachment structure interferes with attachment to the at least one hinge post.

In some embodiments, the first attachment structure is configured to deflect toward the first biasing structure and against a biasing force of the first biasing member as the at least one hinge post is releasably attached to the first attachment structure.

In some embodiments, the first biasing structure is a leaf spring.

In some embodiments, the first biasing structure is formed as an integral part with the first attachment structure.

In some embodiments, the irrigation control box includes a fixed transverse wall positioned at least partially within the hinge assembly frame and extending oblique or perpendicular to a direction in which the basing portion biases the first attachment structure.

In some embodiments, the irrigation control box includes a second hinge post, wherein the offset hinge assembly includes a second hinge module positioned at least partially within the hinge assembly frame, the second hinge module including a second biasing portion and a second attachment structure, wherein the second biasing portion is configured to bias the second attachment structure to a second position in which the second attachment structure interferes with attachment to the second hinge post.

In some embodiments, one or both of the first and second biasing portions contact the transverse wall.

In some embodiments, the first attachment structure is configured to move between a first position and a second position along a length of the hinge assembly frame.

According to some variants, an irrigation control box can include a housing base having at least one hinge post. The control box can include a housing face pack having at least one hinge point. In some embodiments, the control box includes a hinge assembly. The hinge assembly can include one or more hinge mating points configured to rotatably mate with the at least one hinge point of the housing face pack such that the housing face pack rotates about an axis of rotation with respect to the housing base when the one or more hinge mating points are rotatably mated with the at least one hinge point of the housing face pack. In some embodiments, the hinge assembly includes a releasable attachment point configured to releasably attach to the hinge post of the housing base.

In some embodiments, the axis of rotation is positioned further form the housing base than the releasably attachment point when the releasable attachment point is releasably attached to the hinge post of the housing base.

In some embodiments, the irrigation control box includes a first hinge module having a biasing portion and the releasable attachment point, the biasing portion configured to apply a biasing force to the releasable attachment point to maintain the releasable attachment point in a first position.

In some embodiments, the hinge assembly includes a hinge frame, the hinge frame including the one or more hinge mating points.

In some embodiments, the first hinge module is removably connected to the hinge frame.

In some embodiments, the first hinge module includes an elongate track and the hinge frame includes a post, wherein the post is positioned at least partially within the track, and wherein the first hinge module is configured to move between a first position defined by contact between the post and a first end of the track, and a second position defined by contact between the post and a second end of the track opposite the first end of the track.

In some embodiments, the biasing force is applied in a direction parallel to a length of the elongate track.

In some embodiments, the hinge assembly is configured to be rotationally, translationally, and releasably fixed to the housing base when the releasable attachment point is releasably attached to the hinge post of the housing base.

A method of assembling and disassembling an irrigation control box can include providing a housing base having at least one hinge post. In some embodiments, the method includes providing a housing cover having at least one hinge structure. The method can include providing an offset hinge assembly. In some embodiments, the method includes connecting a hinge structure of the offset hinge assembly to the at least one hinge structure of the housing cover. The method can include releasably connecting an attachment structure of the offset hinge assembly to the at least one hinge post such that a point of attachment between the attachment structure and the at least one hinge post is closer to the housing base than a hinge attachment point between the hinge structure of the offset hinge assembly and the at least one hinge structure of the housing cover and without use of tools, disconnecting the attachment structure of the offset hinge assembly from the at least one hinge post.

In some embodiments, disconnecting the attachment structure of the offset hinge assembly from the at least one hinge post comprises translating a tab of the offset hinge assembly from a connected position to a disconnected position.

BRIEF DESCRIPTION OF THE DRAWINGS

The present inventions are described with reference to the accompanying drawings, in which like reference characters reference like elements, and wherein.

FIG. 6 is a front, left, bottom exploded view of a hinge assembly.

FIG. 7 is a back left, bottom exploded view of the hinge assembly of FIG. 6.

DETAILED DESCRIPTION

Irrigation systems often include control boxes having facepacks or other user interface portions which allow a user of the irrigation system to set various controls. The control boxes are often mounted on walls, posts, in sheds, in electrical boxes, or in other fixed positions. It is often desirable to disconnect the facepacks from the control boxes in order to modify the parameters of the irrigation system without the need to remain positioned near the remainder of the control box.

Previous designs for disconnecting facepacks often required precise and/or complicated procedures for connecting and disconnecting the facepacks from the control boxes. The facepacks sometimes had integrated moveable posts configured to engage with and disengage from posts in the base of a control box. Connecting these facepacks to the posts required precise alignment of the moveable posts with the posts of the base and often required that the user simultaneously hold one or more tabs or other components of the facepack at the same time.

Figure 1:
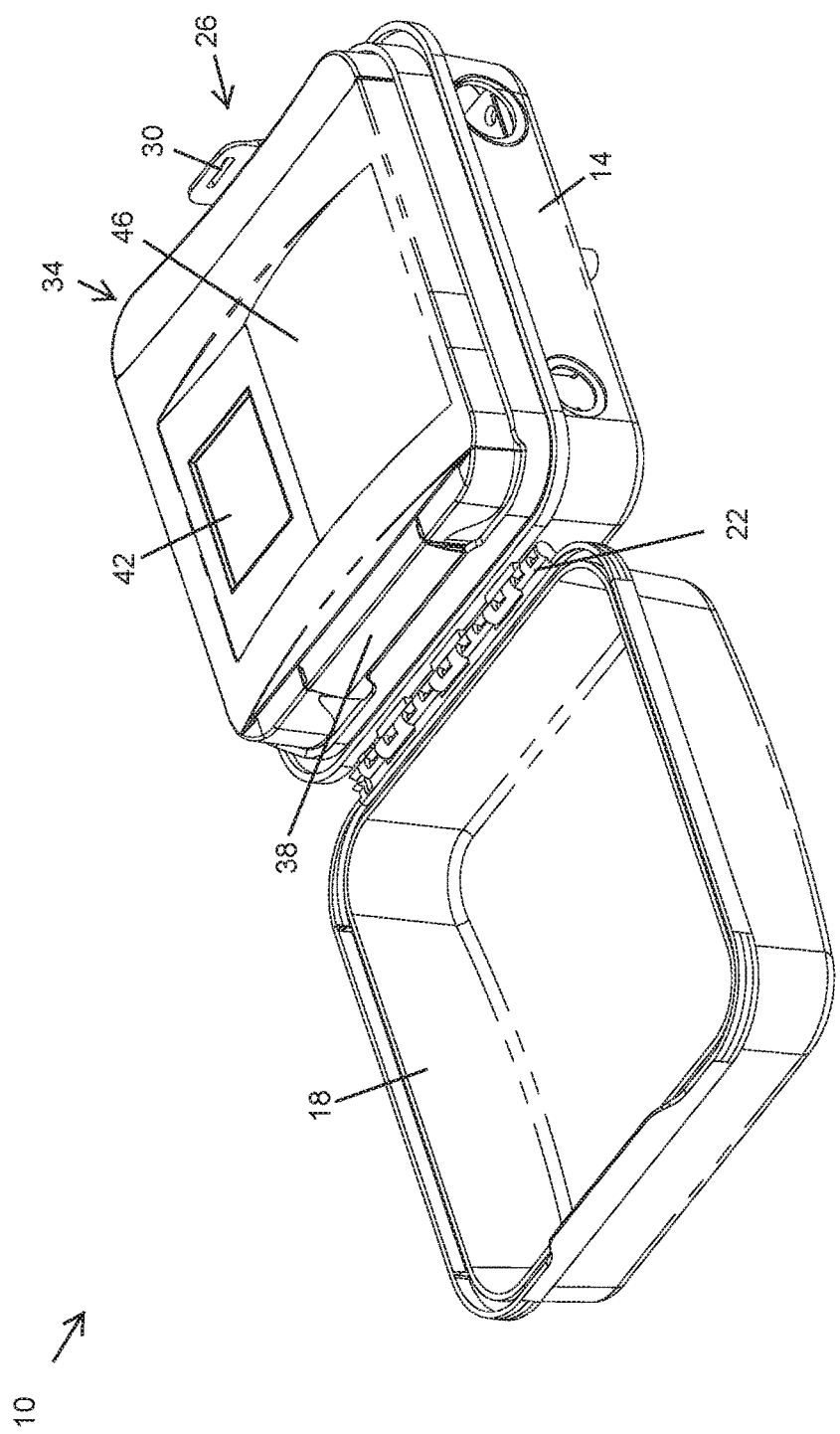
FIG. 1 is a front, left, bottom perspective view of an irrigation control box with the outer cover in an opened position and the facepack in a closed position.
Figure 4:
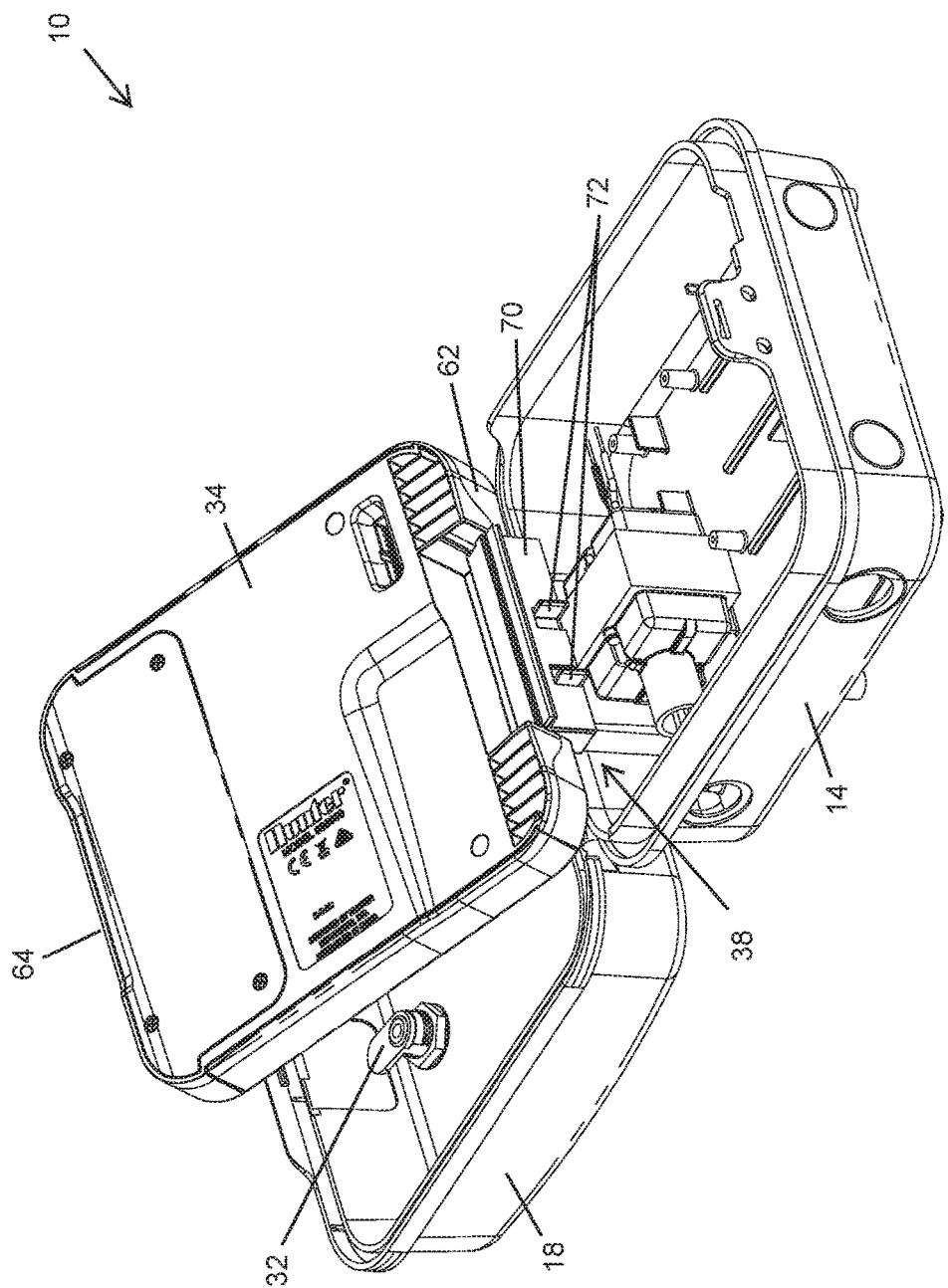
FIG. 4 is a front, right, bottom perspective view of the irrigation control box of FIG. 1, with both the facepack and outer cover in the opened position.

FIG. 1 illustrates an embodiment of an irrigation control box 10 configured to facilitate easy and quick engagement and disengagement of a facepack from a base portion of the control box. As illustrated, the box 10 can include a base portion 14. An outer cover 18 can be connected to the base portion 14. As illustrated, the outer cover 18 can be connected to the base portion 14 via a hinge 22. The outer cover 18 can be configured to rotate about the hinge 22 between an opened position (FIG. 1) and a closed position (not shown). In the closed position, the outer cover 18 can engage at a latch 26 on the base portion 14. The latch 26 can include an aperture 30, protrusion, indentation, ridge, detent, or other structure configured to releasably couple with a portion of the outer cover 18. In some embodiments, the outer cover 18 includes a lock 32 (FIG. 4). The lock 32 can be, for example, a rotating or translating lock configured to selectively interface with the aperture 30 (e.g., via rotation of a key, knob, or other user input structure connected to the lock 32).

As illustrated in FIG. 1, the irrigation control box 10 can include an inner cover or facepack 34. The facepack 34 can be connected to the base portion 14 via a hinge assembly 38 (e.g., an offset hinge assembly). The facepack 34 can include one or more buttons, knobs, switches, or other user input structures. In some embodiments, the facepack 34 includes one or more screens 42 (e.g., touch screens and/or displays) on a front side 46 of the facepack 34. The facepack 34 can function as the user control interface for an irrigation and/or lighting system. Using the facepack 34, the user or technician can modify irrigation schedules, flow rates, and many other parameters.

Figure 2:
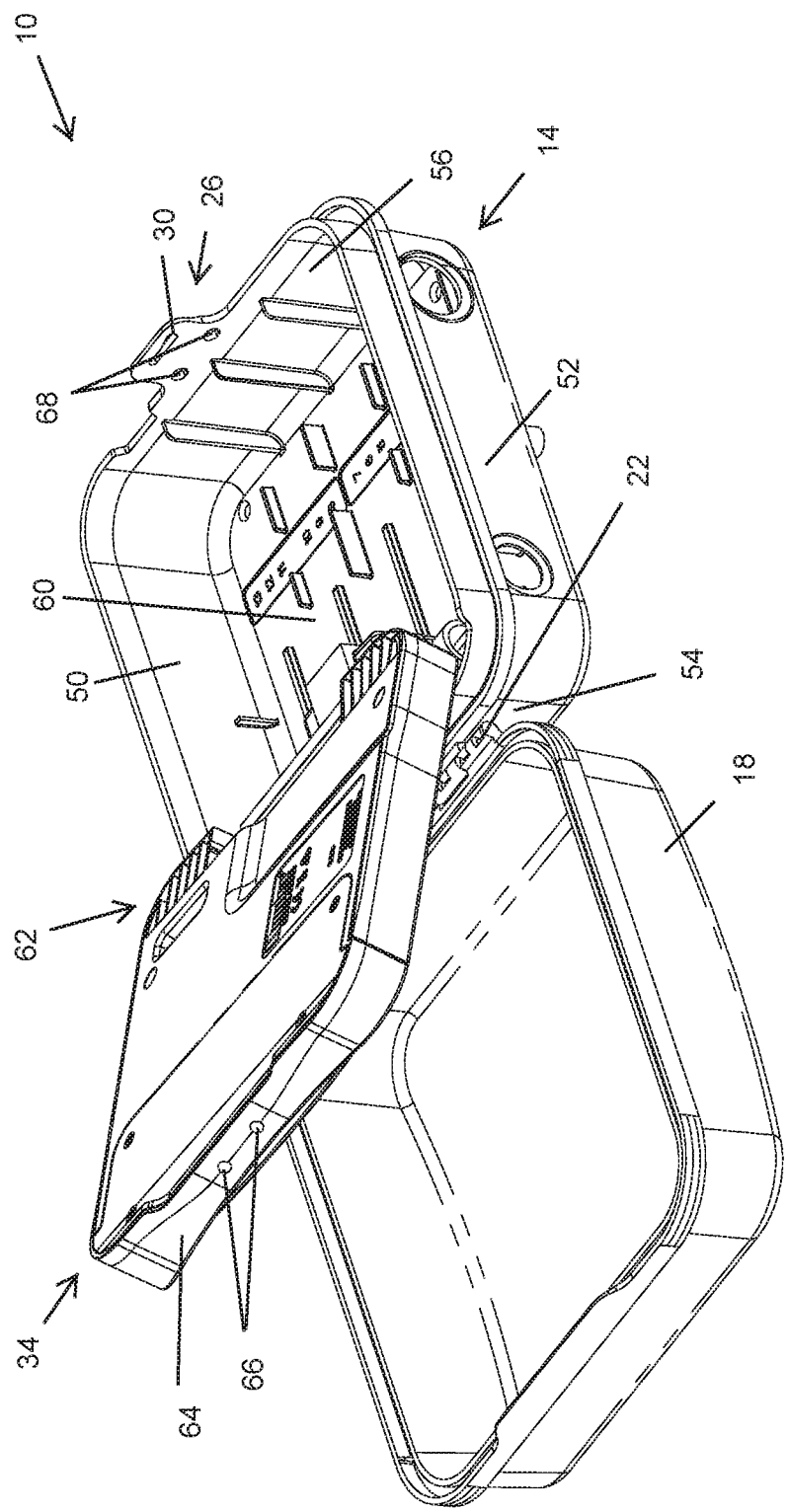
FIG. 2 is a front, left, bottom perspective view of the irrigation control box of FIG. 1, with both the outer cover and the facepack in an opened position.

As illustrated in FIG. 2, the base portion 14 can have a generally rectangular prism shape. Other shapes are also possible (e.g., triangular or other polygonal prisms, cylindrical, conical, frustoconical, or other shapes). In the illustrated example, the base portion 14 includes a first wall 50 (e.g., a top wall), a second wall 52 (e.g., a bottom wall) opposite the first wall 50, a third wall 54 (e.g., a hinge wall) connected to and extending between the first and second walls 50, 52, and a fourth wall 56 (e.g., a latch wall) opposite the third wall 54 and connected to and extending between the first and second walls 50, 52. The base portion 14 can include a fifth wall 60 (e.g., a back wall or mounting wall) connected to one or more of the first, second, third, and fourth walls 50, 52, 54, 56. The base portion 14 can include a mounting structure configured to facilitate mounting the base portion 14 to a wall, pole, tabletop, fence, or other mounting site. The mounting structure can be, for example, one or more apertures for fasteners, one or more brackets, and/or other structures. The mounting structure(s) can be positioned on a rear surface (not shown) of the fifth wall 60. In some embodiments, one or more mounting structures are positioned on surfaces of the first, second, third, and fourth walls 50, 52, 54, 56.

The facepack 34 can have a first end 62 (e.g., a hinge end) and a second end 64 (e.g., a latch end) opposite the first end 62. The second end 64 can include one or more latching features 66. The latching features 66 can be configured to facilitate coupling between the second end 64 of the facepack 34 and the base portion 14 (e.g., the latch 26). In some embodiments, the latching features 66 include one or more protrusions configured to engage with one or more indentations or aperture in the latch 26. For example, the latching features 66 on the second end 64 of the facepack 34 can be one or more protrusions configured to engage with one or more second apertures 68 or indentations on the latch 26. Preferably, the second apertures 68 are positioned behind (e.g., closer to the fifth wall 60) the aperture 30.

As illustrated in FIG. 4, the facepack 34 can rotated about the hinge assembly 38. The hinge assembly 38 can include a hinge body or frame 70. The hinge assembly 38 includes at least one release mechanism configured to facilitate separation of the facepack 34 and/or hinge assembly 38 from the base portion 14. The at least one release mechanism can be, for example, one or more tabs 72 protruding from the frame 70. The tabs 72 can be configured to move toward each other, away from each other, or in a common direction to release the hinge assembly 38 from the base portion 14. In the illustrated embodiment, the tabs 72 are configured to be moved toward each other (e.g., pinched or squeezed) to release the hinge assembly 38 from the base portion 14.

Figure 5:
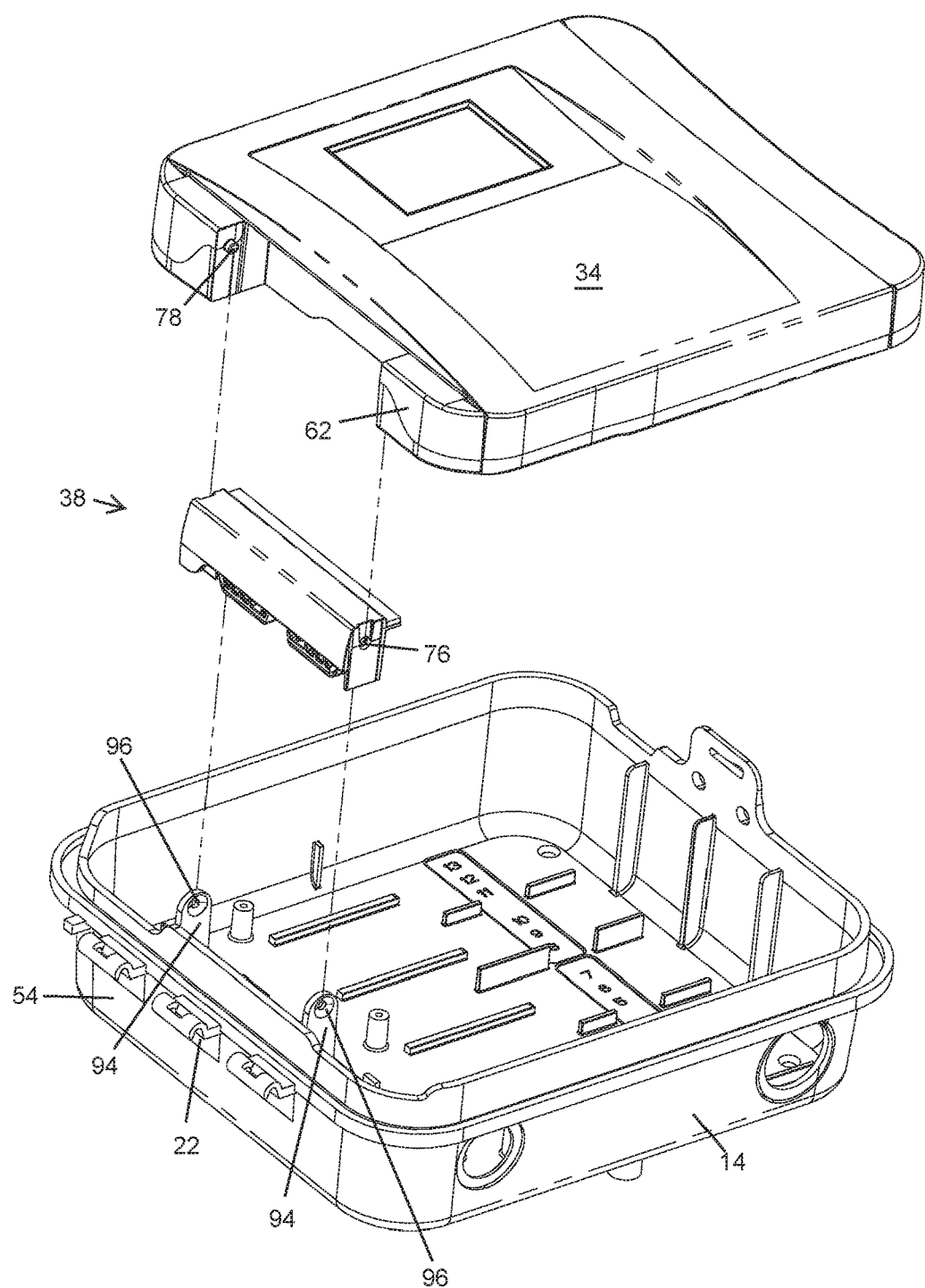
FIG. 5 is an exploded view of the irrigation control box of FIG. 1, with the outer cover removed.

Moving to FIG. 5, the hinge assembly 38 can include one or more hinge mating features 76. The hinge mating features 76 can be, for example, protrusions, indentations, posts, apertures, detents, or other structures configured to couple with one or more facepack mating features 78 (e.g., protrusions, indentations, posts, apertures, detents, or other structures). In the illustrated embodiment, the hinge mating feature 76 are apertures and the facepack mating features 78 are protrusions configured to extend at least partially into the apertures. Engagement between the hinge mating features 76 and facepack mating features 78 can define an axis of rotation about which the facepack 34 rotates with respect to the hinge assembly 38 and/or base portion 14.

In some embodiments, the engagement between the hinge mating features 76 and the facepack mating features 78 is releasable without tools. In some embodiments, the engagement between the hinge mating features 76 and the facepack mating features 78 requires tools and/or at least partial disassembly of the facepack 34 and/or hinge assembly 38 to disengage the hinge mating features 76 from the facepack mating features 78. In some embodiments, the engagement between the hinge mating features 76 and the facepack mating features 78 is not intended to be releasable. In some embodiments, some components of the facepack 34 and/or hinge assembly 38 may have to be destroyed, or broken, to disengage the hinge mating features 76 from the facepack mating features 78.

FIGS. 6 and 7 illustrate an embodiment of a hinge assembly 38. The frame 70 can include one or more walls. The walls can define a perimeter of the frame 70. In some embodiments, the frame 70 has four walls: a first wall 80a positioned away from an interior of the irrigation control box 10 when the irrigation control box 10 is assembled; a second wall 80b positioned opposite the first wall 80a; a third wall 80c (e.g., a top wall) extending between and connected to the first and second walls 80a, 80b; a fourth wall 80d (e.g., a bottom wall) opposite the third wall 80c and extending between the first and second walls 80a, 80b, and/or a fifth wall 80e (e.g., a front wall) connected to one or more of the first, second, third, and fourth walls 80a, 80b, 80c, 80d of the frame 70. One or more of the walls of the frame 70 can include cutouts, ridges, apertures, or other features.

As illustrated, the hinge mating features 76 can be positioned at the ends of the frame 70 (e.g., on or in the third and/or fourth walls 80c, 80d). The third and fourth walls 80c, 80d can include a channel 82 configured to facilitate mating between the hinge mating features 76 and facepack mating features 78. The channel 82 can extend from the front ends of the third and fourth walls 80c, 80d (e.g., from the fifth wall 80e) to or past the hinge mating features 76. During assembly of the irrigation control box 10, the facepack mating features 78 can travel along the channels 82 until they enter the hinge mating features 78. At least one of the third frame wall 80c, fourth frame wall 80d, the facepack 34, and facepack mating features 78 may be configured to deflect or deform as the facepack mating features 78 travel along the channels 82.

The hinge assembly 38 can include one more engagement modules 84. The engagement modules 84 can be positioned at least partially within the frame 70. The engagement modules 84 can be configured to facilitate releasably engagement between the hinge module 38 and the base portion 14. The hinge modules 84 can be configured to couple with the frame 70. Preferably, all or a portion of the hinge modules 84 are configured to translate or rotate with respect to the frame 70 when the hinge modules 84 are coupled to the frame 70.

The hinge modules 84 can include one or more tracks 86. The tracks 86 can be, for example, elongate apertures having longitudinal lengths (e.g., measured parallel to the first wall 80a when the hinge assembly 38 is assembled) and lateral widths (e.g., measured perpendicular to the first wall 80a when the hinge assembly 38 is assembled). Posts 88 or other structures can extend at least partially through the tracks 86. The posts 88 can be connected to one or more walls of the frame 70. In the illustrated embodiments, the posts 88 are connected to and extend from the fifth wall 80e of the frame 70. In some embodiments, the posts 88 are formed integrally with the frame 70. One or more fasteners 90, clips, plugs, rivets, buttons, or other structures can be connected to the posts 88 and/or tracks 86 to facilitate coupling of the hinge modules 84 to the frame 70. In the illustrated embodiment, fasteners 90 are inserted through the tracks 86 and through at least a portion of the posts 88 to connect the hinge modules 84 to the frame 70.

Figure 8:
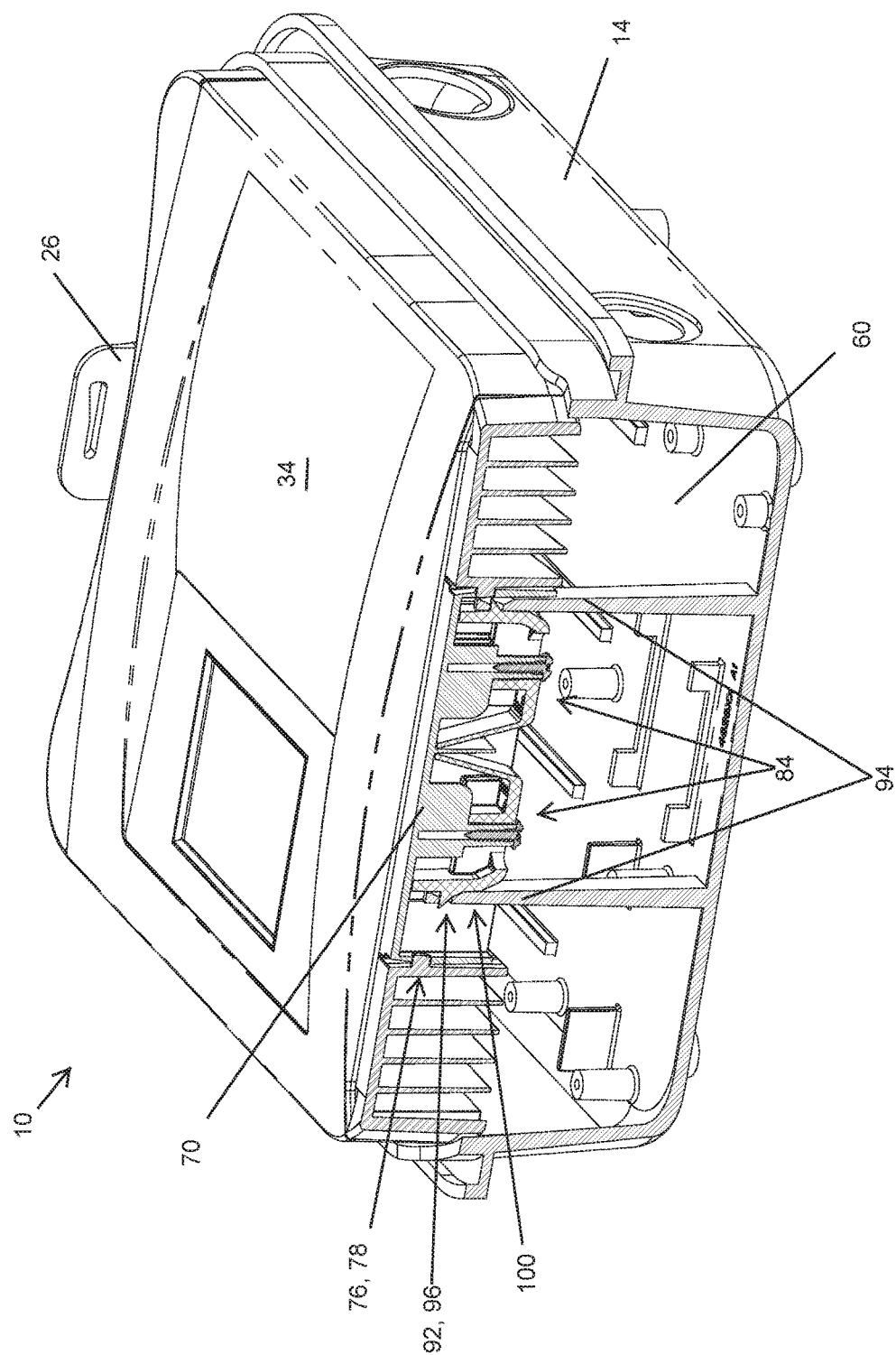
FIG. 8 is front, left, bottom perspective cross-section view of the irrigation control box of FIG. 1, with the facepack in the closed position.

As illustrated in FIG. 7, the hinge modules 84 can include engagement features 92. The engagement features 92 can be, for example, protrusions extending from a wall of the hinge modules 84. In some embodiments, the engagement features 92 are indentations or apertures. The engagement features 92 can be configured to couple with a structure of the base portion 14. For example, the base portion 14 can include one or more hinge posts 94 (FIGS. 5 and 8). The hinge posts 94 can be connected to one or more of the walls 50, 52, 54, 56, 60 of the base portion 14. In the illustrated embodiment, the hinge posts 94 are connected to both the third wall 54 and the fifth wall 60 of the base portion 94. The hinge posts 94 can extend forward from the fifth wall 60 (e.g., upward in the frame of reference of FIG. 3). In some embodiments, the hinge posts 94 extend beyond the front edges of one or more of the walls of the base portion 14. The hinge posts 94 can include a post engagement feature 96 configured to engage with the engagement features 92 of the hinge modules 84. As described in more detail below, the engagement between the engagement features 92 of the hinge modules 84 and the post engagement features 96 can be releasable.

Figure 9:
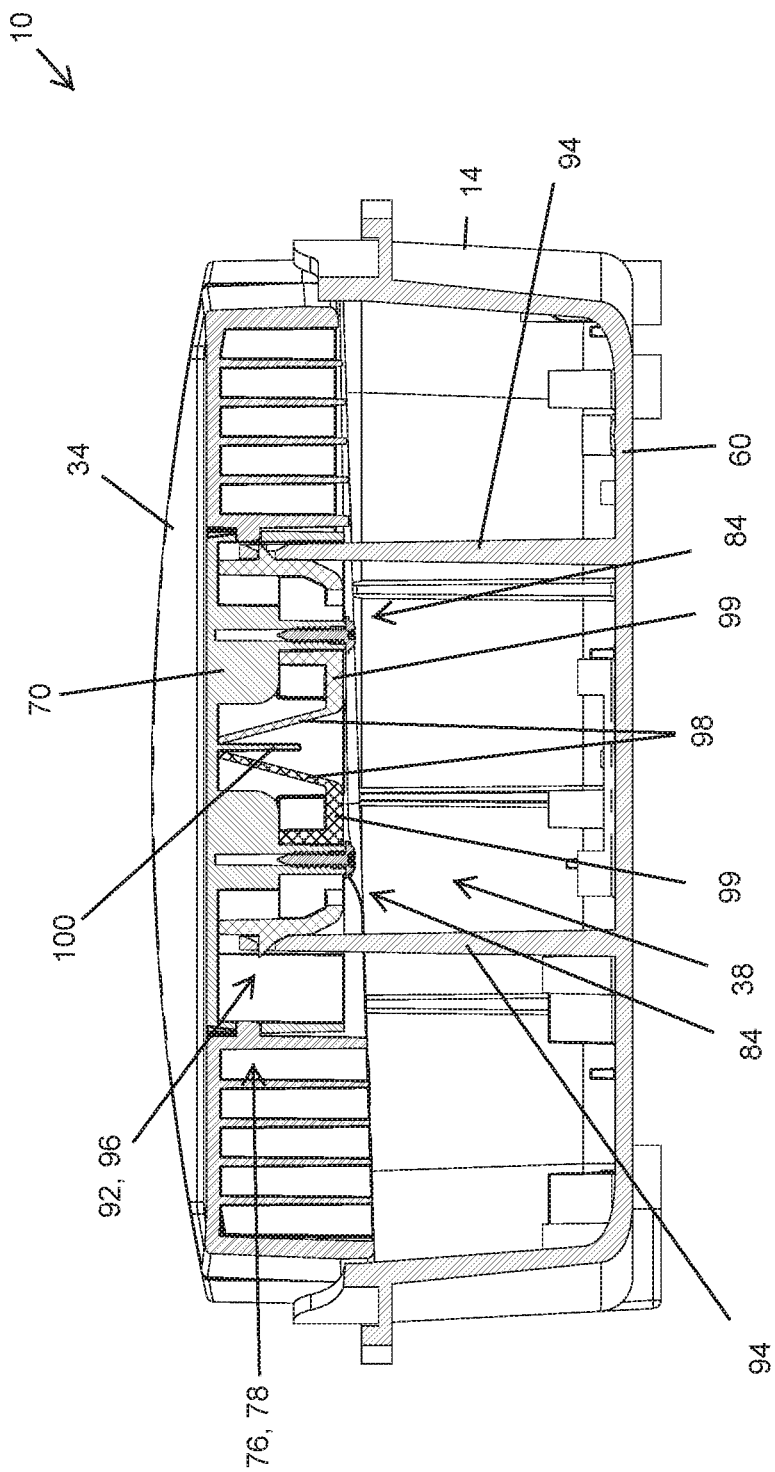
FIG. 9 is a left plan cross-section view of the irrigation control box of FIG. 1, with the facepack in the closed position.
Figure 9A:
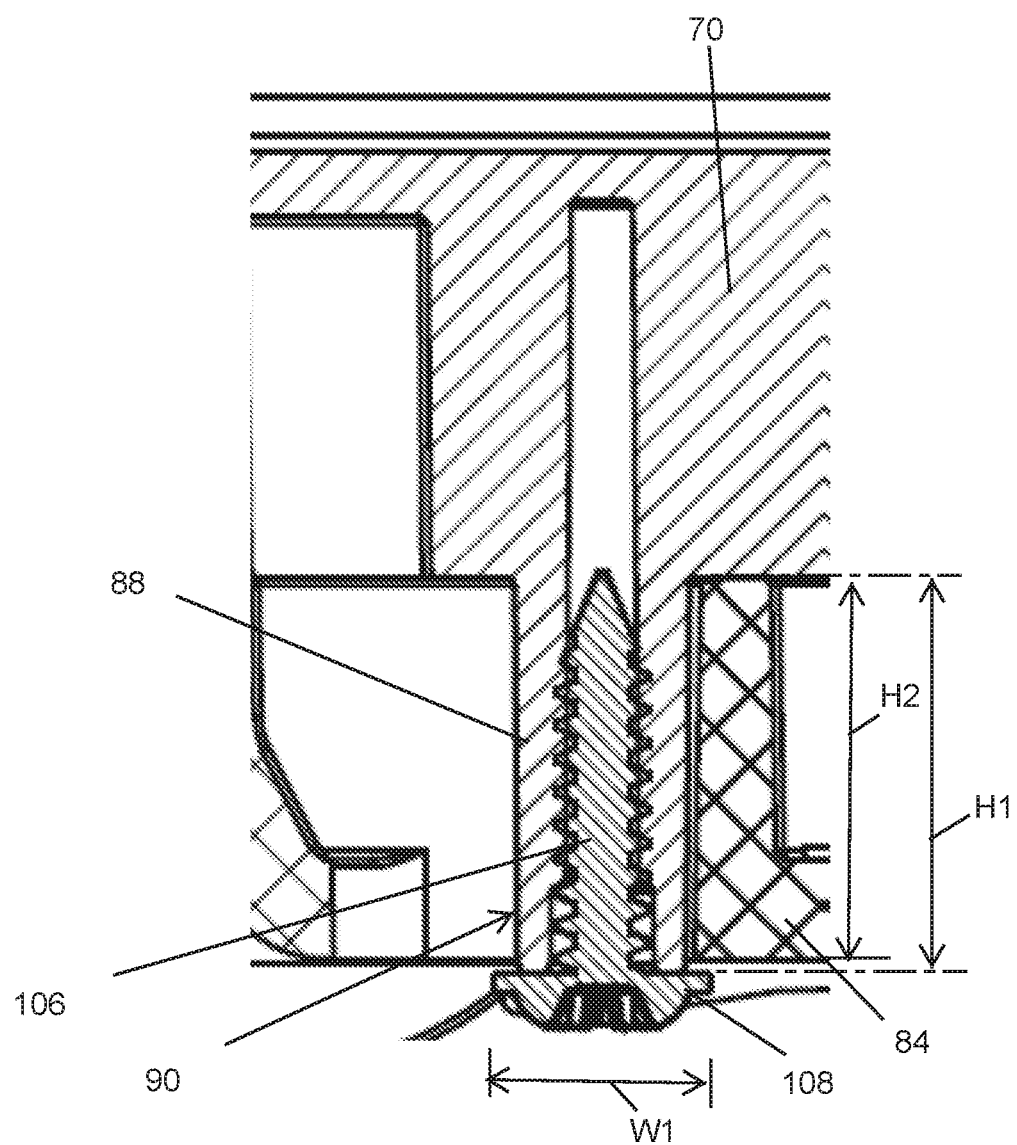
FIG. 9A is a close up left plan cross-section view of the irrigation control box of FIG. 1, with the facepack in the closed position.

FIGS. 8-9A illustrate a cross-section of the irrigation control box 10 when the facepack 34 is in a closed position and with the outer cover 18 removed. As illustrated the hinge modules 84 can include biasing portions 98. The biasing portion may comprise any suitable structure such as a coil spring, flat spring, arched or leaf spring of any deformable material. In some embodiments, the biasing portion may be a deformable, flexible, and/or resilient material such as an elastomer, rubber, urethane, silicone, foam, or other deformable material with a memory of suitable form. The biasing portions 98 can be, for example, leaf springs. The leaf springs can be formed as an integral part with or as a separate part from the remainder of the hinge module 84. For example, the leaf springs (e.g., biasing portions 98) can be connected to the engagement features 92 of the hinge modules 84 via an intermediate portion 99. The intermediate portions 99 of the hinge modules 84 can be, for example, a wall extending between the biasing portions 98 and the engagement features 92. The intermediate portion 99 can extend generally parallel to the first and second walls 80*a*, 80*b* of the frame 70.

In the illustrated embodiment, the hinge assembly 38 includes a transverse wall 100. The transverse wall 100 can be generally parallel to the third and fourth walls 80*c*, 80*d* of the frame 70. The transverse wall 100 can be positioned between the biasing portions 98 of the hinge modules 84. In some embodiments, the biasing portions 98 of the hinge modules 84 contact the transverse wall 100 when the hinge modules 84 are coupled with the frame 70. In some embodiments, the biasing portions 98 are maintained in a compressed, preloaded, stressed, deformed, and/or energized configuration such that the biasing portion 98 continually exerts biasing force on the engagement features 92 toward the engaged position when the hinge module 84 is coupled with the frame 70. Preferably, the biasing portions 98 are maintained in a relaxed configuration such that the biasing portion 98 maintains the engagement features 92 toward the engaged position without deforming the biasing portions 98 when the hinge module 84 is coupled with the frame 70, as illustrated in FIG. 9.

As illustrated in FIG. 9A, the fasteners 90 can include an elongate portion 106 configured to engage the posts 88 of the frame 70. For example, the elongate portion 106 can be a threaded shaft configured to engage with an inner channel (e.g., an internally-threaded channel) of the posts 88. The fasteners 90 can include head portions 108. The head portions 108 can be wider than the elongate portions 106 in a direction perpendicular to the length of the elongate portions 106. In some embodiments, the width W1 of the head portions 108 is greater than the width of the posts 88 as measured perpendicular to the length of the elongate portions 106. Preferably, the width W1 of the head portions 108 is greater than the lateral widths of the tracks 86 in the hinge modules 84. The head portions 108 can be configured to inhibit or prevent inadvertent decoupling of the hinge modules 84 from the frame 70. For example, the head portions 108 can interfere with the intermediate portions 99 of the hinge modules 84 adjacent the tracks 86 in a direction parallel to the lengths of the elongate portions 106 of the fasteners 90.

In some embodiments, the height H1 of the posts 88 (e.g., as measured parallel to the length of the elongate portions 106 of the fasteners 90) can be greater than the height H2 of the hinge module 84 adjacent the tracks 86. For example, the height H1 can be at least 101%, at least 105%, at least 108%, at least 110%, and/or at least 112% of the height H2. In some embodiments, the height H1 is approximately 105% of the height H2. Using posts 88 that are longer (e.g., have greater heights) than the portions of the hinge module 84 adjacent the tracks 86 can reduce the likelihood that the fasteners 90 compress, clamp, or otherwise apply pressure to the hinge modules 84. Avoiding or reducing pressure applied to the hinge modules 84 by the fasteners 90 reduces the likelihood that the fasteners 90 interfere with movement of the hinge modules 84 in directions perpendicular to the length of the elongate portions 106 of the fasteners 90.

Figure 3:
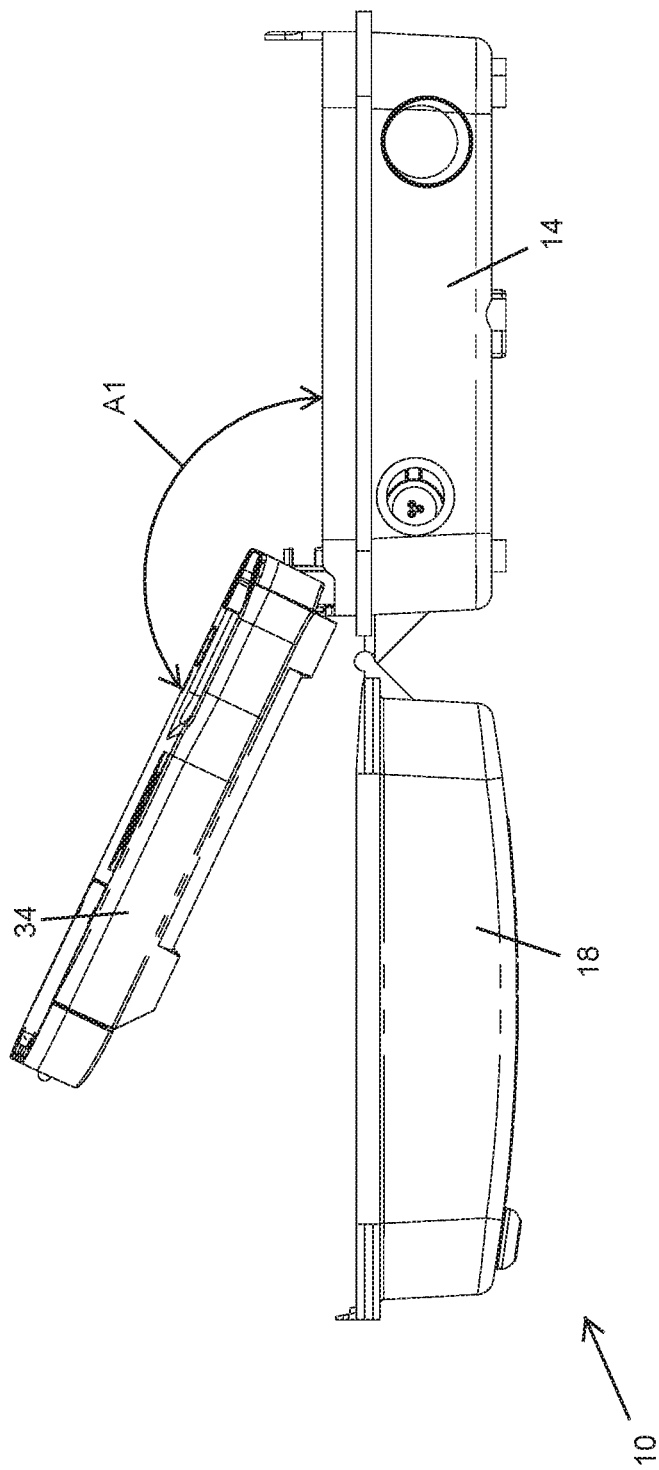
FIG. 3 is a bottom plan view of the irrigation control box of FIG. 1, with both the outer cover and the facepack in the opened position.
Figure 10:
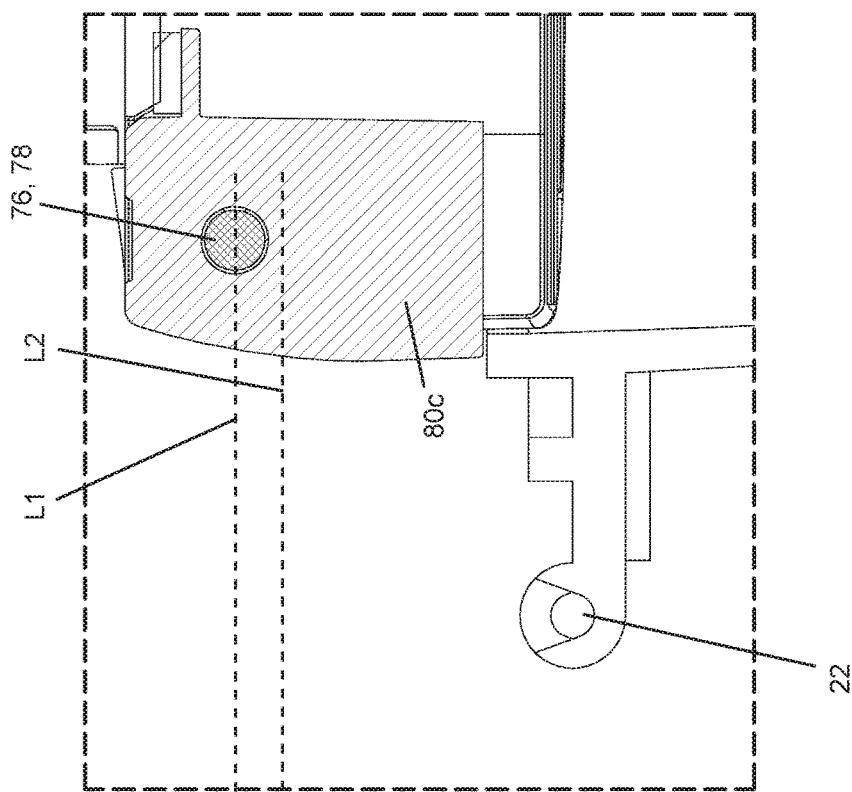
FIG. 10 is a close-up bottom cross-section view of the hinge post and hinge module of an irrigation control box.
Figure 11:
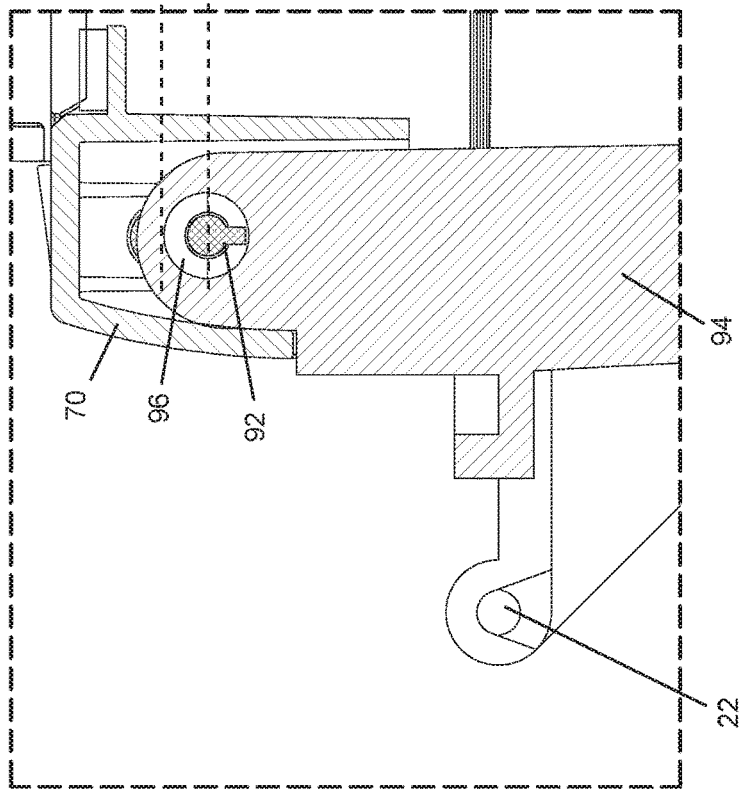
FIG. 11 is a close-up bottom cross-section view of the top wall of hinge module of an irrigation control box.
Figure 12:
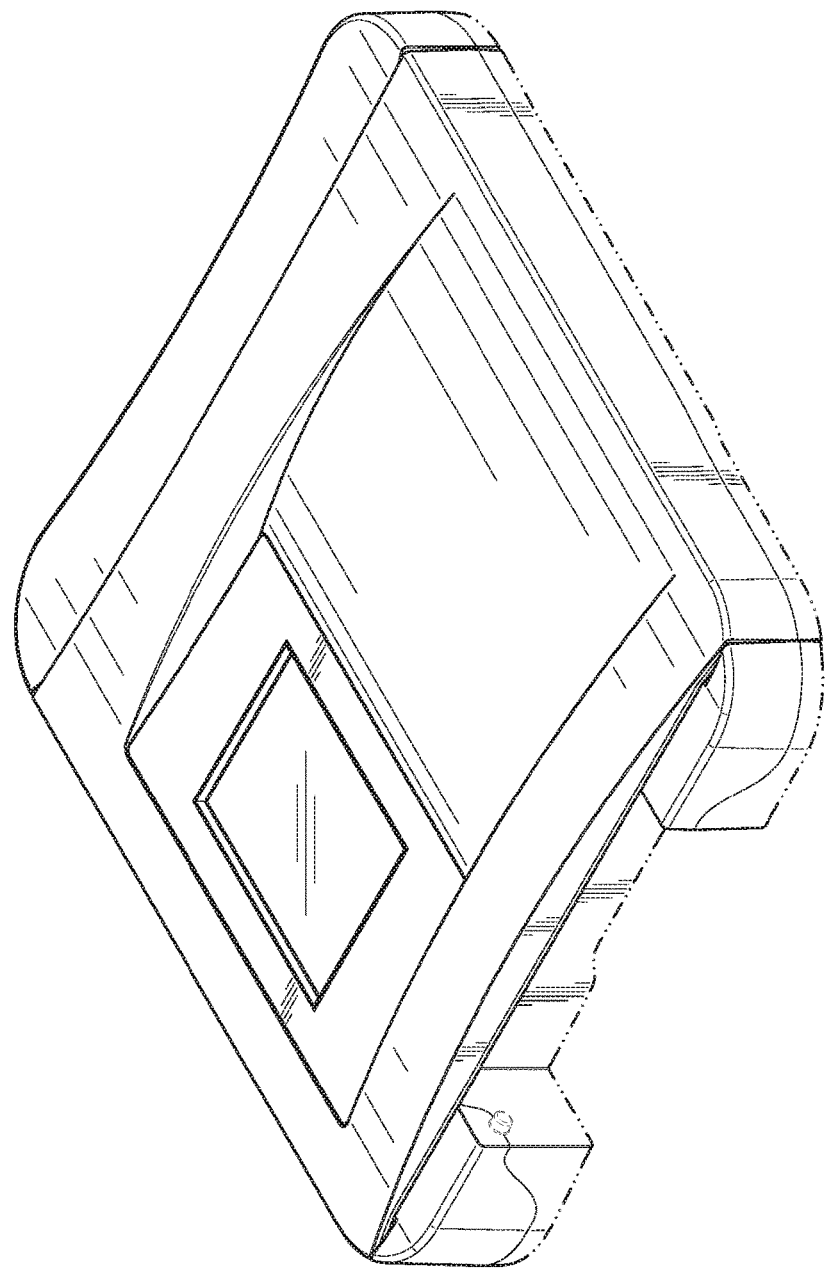
FIG. 12 is a front, left, bottom perspective view of an embodiment of a facepack.
Figure 13:
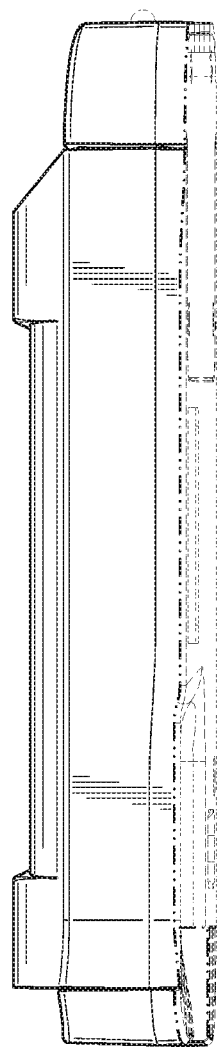
FIG. 13 is a bottom plan view of the facepack of FIG. 12.
Figure 14:
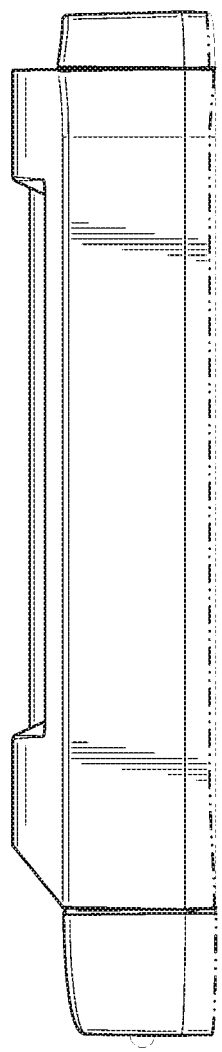
FIG. 14 is a top plan view of the facepack of FIG. 12.
Figure 15:
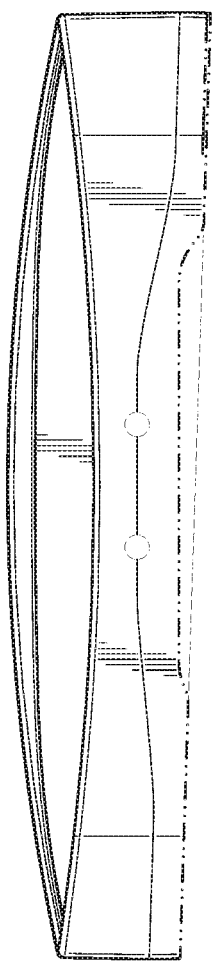
FIG. 15 is a right-side plan view of the facepack of FIG. 12.
Figure 16:
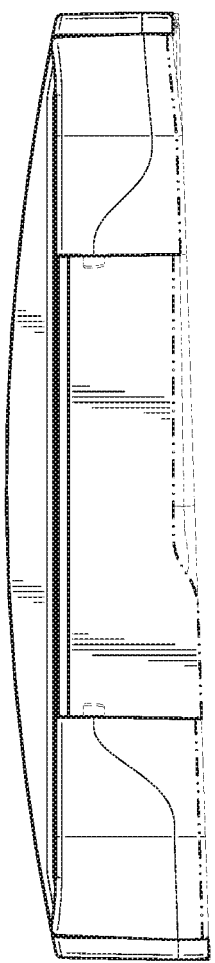
FIG. 16 is a left-side plan view of the facepack of FIG. 12.
Figure 17:
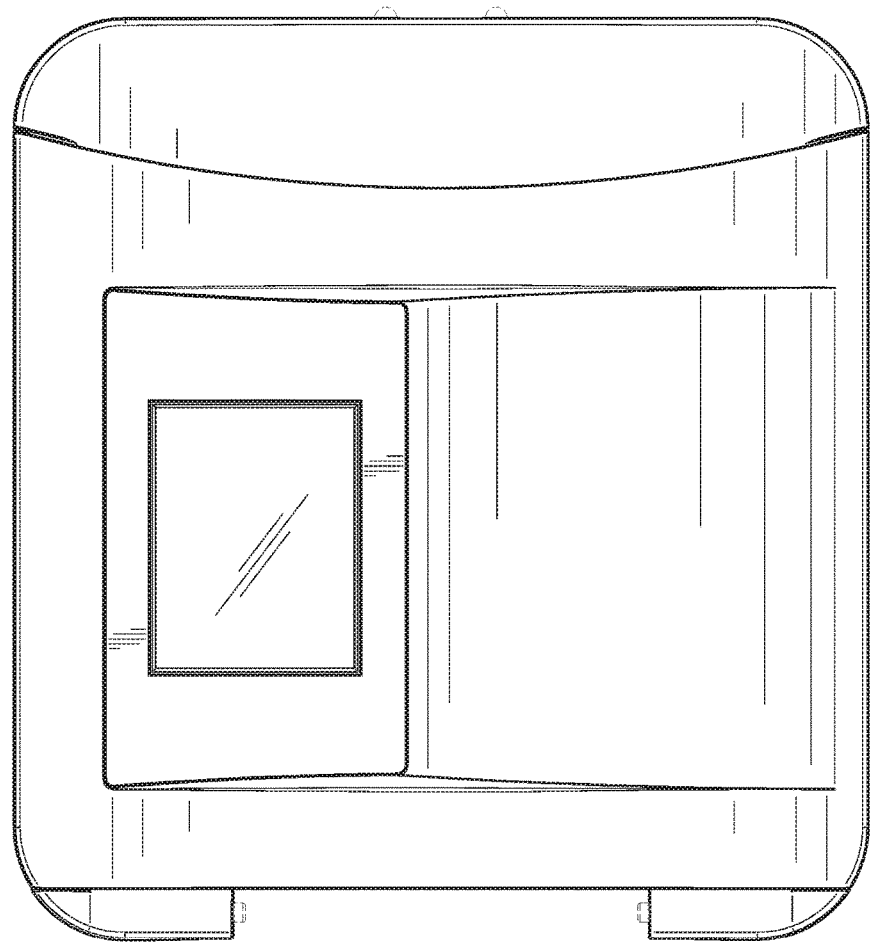
FIG. 17 is a front plan view of the facepack of FIG. 12.
Figure 18:
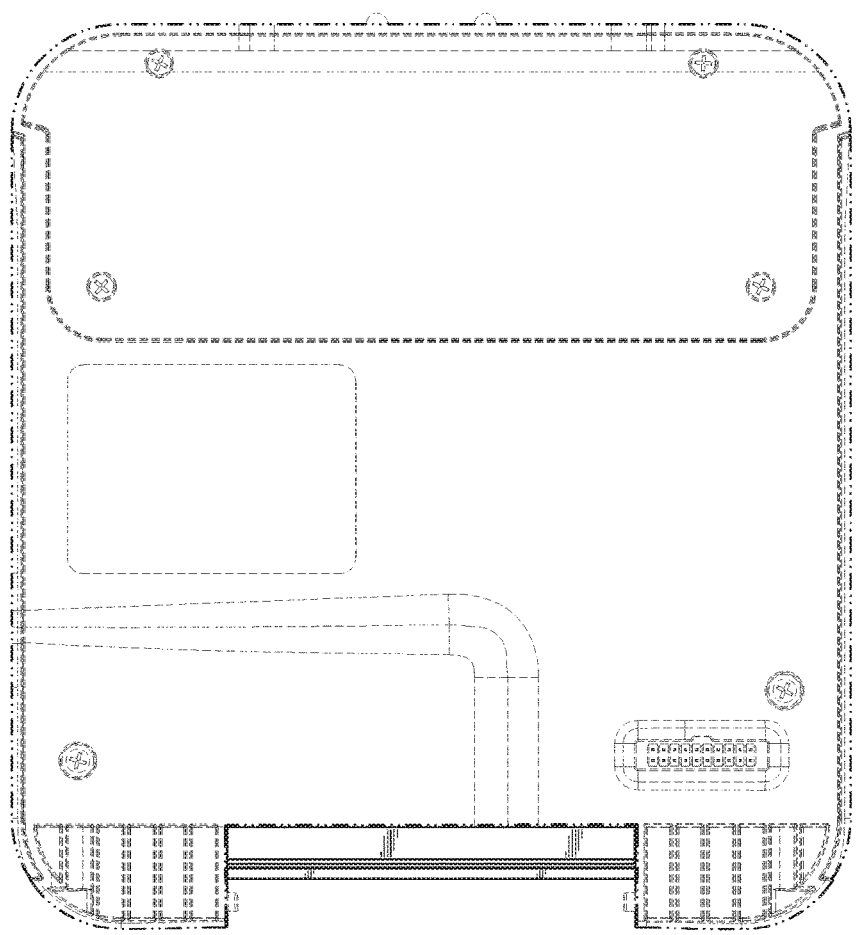
FIG. 18 is a back-plan view of the facepack of FIG. 12.
Figure 19:
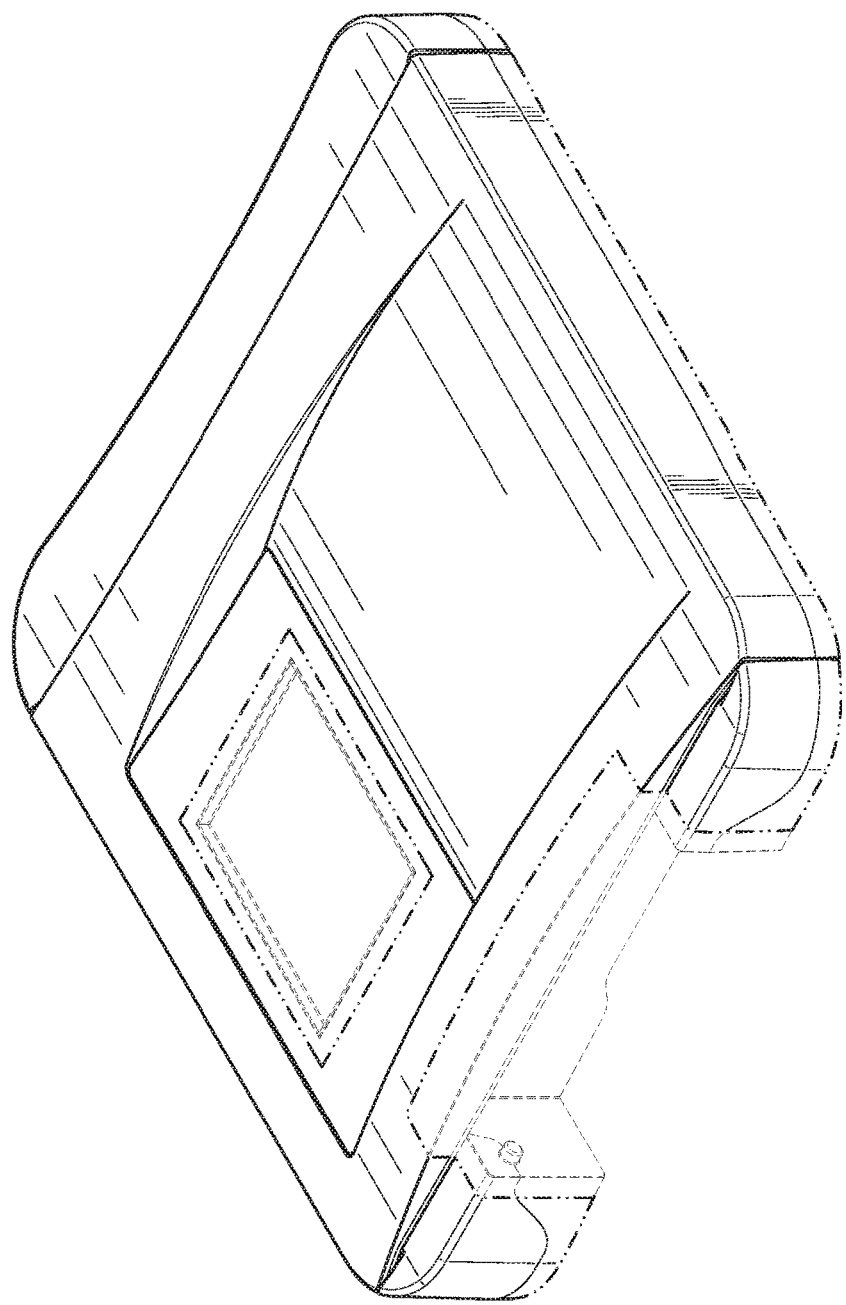
FIG. 19 is a front, left, bottom perspective view of an embodiment of a facepack.
Figure 20:
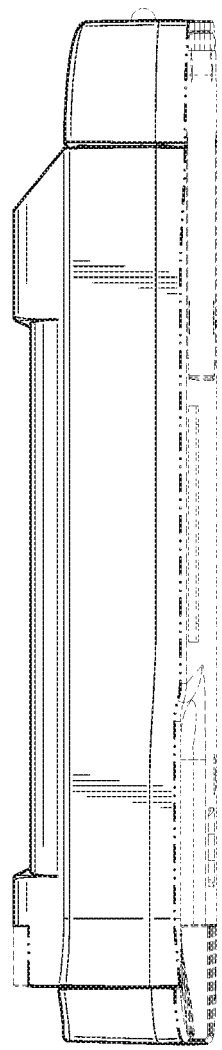
FIG. 20 is a bottom plan view of the facepack of FIG. 19.
Figure 21:
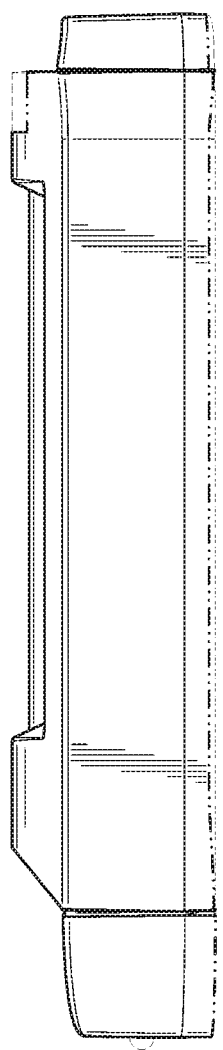
FIG. 21 is a top plan view of the facepack of FIG. 19.
Figure 22:
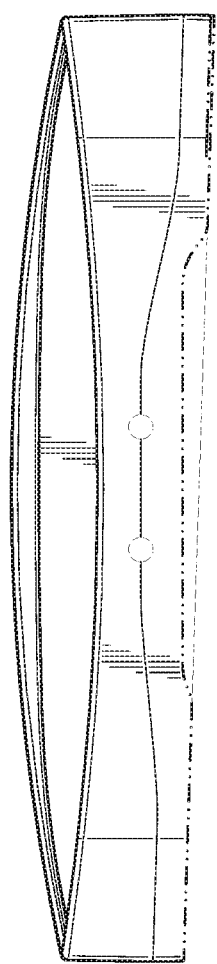
FIG. 22 is a right-side plan view of the facepack of FIG. 19.
Figure 23:
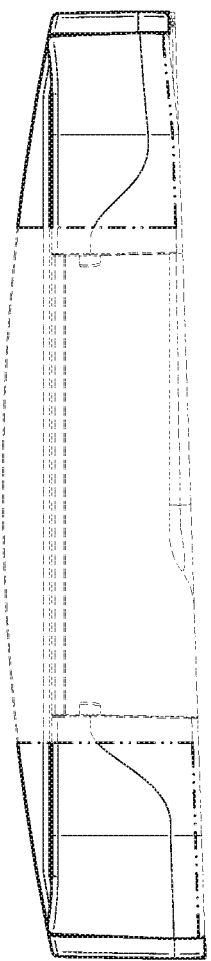
FIG. 23 is a left-side plan view of the facepack of FIG. 19.
Figure 24:
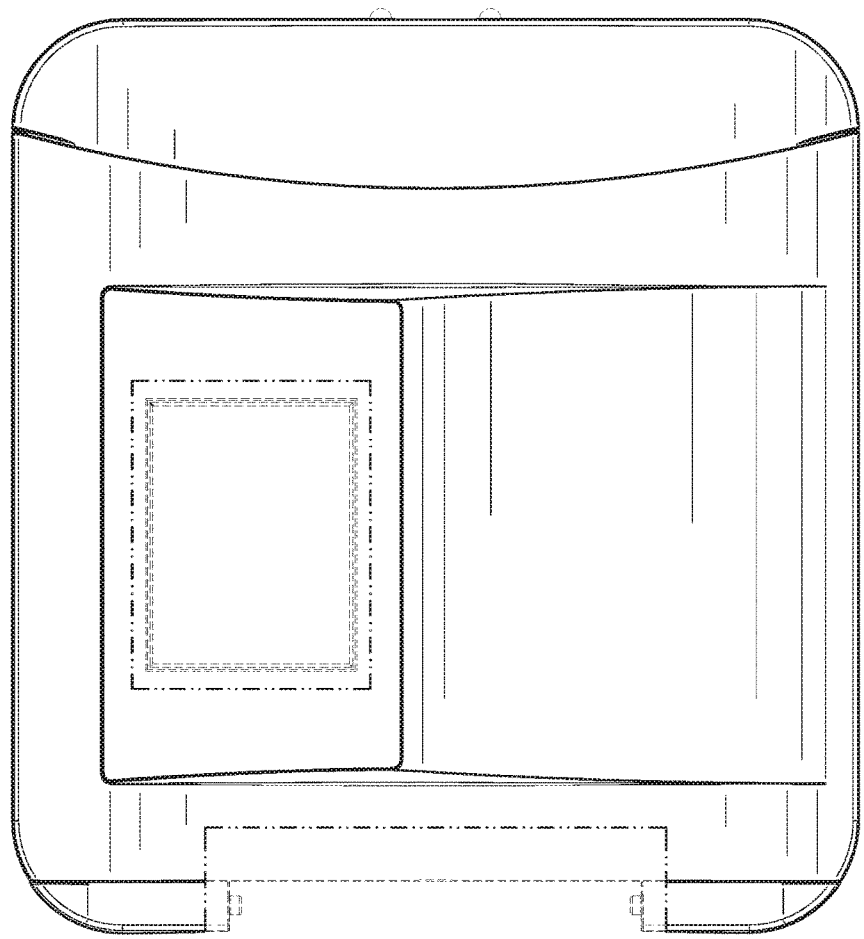
FIG. 24 is a front plan view of the facepack of FIG. 19.
Figure 25:
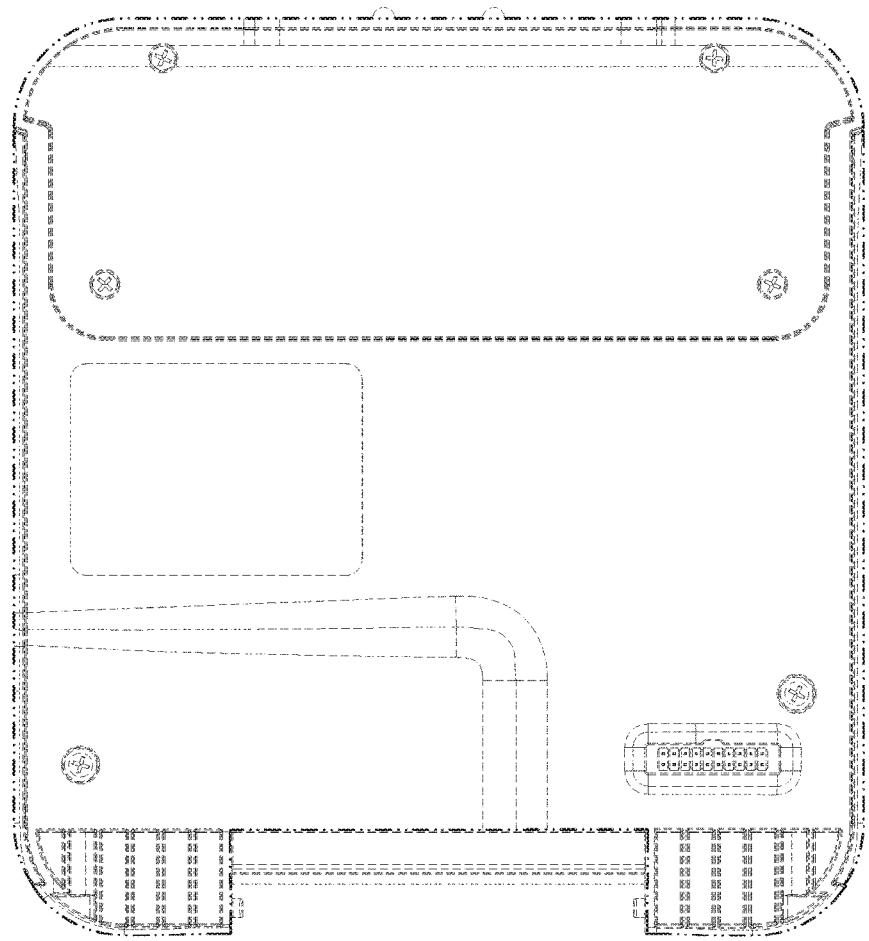
FIG. 25 is a back-plan view of the facepack of FIG. 19.

In some embodiments, the engagement point between the engagement features 92 of the hinge modules 84 and the post engagement features 96 can be positioned on a different axis than the engagement point of the mating features 76 of the frame 70 and the facepack mating features 78. In one embodiment, as illustrated in FIGS. 10 and 11, the engagement point between the engagement features 92 of the hinge modules 84 and the post engagement features 96 can be positioned behind (e.g., lower in the frame of reference of FIGS. 10 and 11) the engagement point of the mating features 76 of the frame 70 and the facepack mating features 78. This relative position is illustrated by the gap between the line L1 that runs through the engagement point of the mating features 76, 78 (e.g., the hinge point of the facepack 34 relative to the hinge assembly 38) in a direction generally parallel to the back wall 60 of the base portion 14 and the line L2 that runs parallel to the line L1 through the engagement point of the engagement features 92, 96. This relative positioning can allow the facepack 34 to open at a wide angle with respect to the base portion 14. As illustrated in FIG. 3, the angle A1 between the facepack 34 and the base portion 14 (e.g., the back wall 60 of the base portion 14) can be at least 120°, at least 125°, at least 130°, at least 135°, at least 140°, and/or at least 150°. In some embodiments, the angle A1 between the facepack 34 and the base portion 14 is approximate 165°. Wide opening of the facepack 34 relative to the base portion 14 can facilitate easier access to the tabs 72 for removal of the facepack 34 from the base portion 14 and can provide for easier access to components within the base portion 14. In some embodiments, the engagement point between the engagement features 92 of the hinge modules 84 and the post engagement features 96 can be positioned on the same axis as the engagement point of the mating features 76 of the frame 70 and the facepack mating features 78. In such embodiments, the line L1 that runs through the engagement point of the mating features 76, 78 (e.g., the hinge point of the facepack 34 relative to the hinge assembly 38) in a direction generally parallel to the back wall 60 of the base portion 14 and the line L2 that runs parallel to the line L1 through the engagement point of the engagement features are on the same axis.

A method of assembling and disassembling the irrigation control box 10 can include connecting the hinge assembly 38 to the facepack 34. As described above, connection between the hinge assembly 38 and facepack 34 can be accomplished, in some configurations, by sliding the facepack mating features 78 along the channel 82 and into engagement with the mating features 76 of the hinge assembly 38 (e.g., of the frame 70). Upon engagement between the facepack 34 and the hinge assembly 38, the facepack 34 can rotate with respect to the hinge assembly 38 about the connection points between the mating features 76, 78.

The facepack 34 and hinge assembly 38 can be connected to the base portion 14 by engaging the engagement features 92 of the hinge modules 84 with the post engagement features 96. In some cases, the facepack 34 and hinge assembly 38 can be connected to hinge posts 94 of a base portion designed for engagement with the facepacks of previous designs. As such, the hinge assembly 38 can be used to retrofit a facepack onto a base portion designed for older technology.

In order to connect the facepack 34 to the base portion 14, the user can align the hinge assembly 38 with the posts 94 or other structure from the base portion 14. This alignment can be enabled by, for example, aligning the frame 70 of the hinge assembly 38 with the posts 94. The hinge assembly 38 can then be pressed into engage with the posts 94, without the need for other user manipulation of hinge assembly 38 or base portion 14. As the hinge assembly 38 is pressed onto the posts 94, the posts contact a sloped surface of the hinge modules 38. For example, the engagement portions (e.g., protrusions) 92 of the hinge modules 38 can include a sloped surface (e.g., a surface oblique to the third and fourth walls 80c, 80d of the frame 70). The posts 94 can deflect the engagement portions 92 via a camming action. The deflecting force of the posts 94 against the engagement portions 92 can oppose the biasing force of the biasing portion 98 of the hinge modules 84. When the engagement portions 92 of the hinge modules 84 align with the hinge post engagement portions 96 (e.g., indentation or apertures), the engagement portions 92 can deflect into engagement with the hinge post engagement portions 96 under force of the biasing portions 98. Inadvertent disengagement of the engagement portions 92 from the hinge post engagement portions 96 is inhibited or prevented by interference between the engagement portions 92, 96. In some embodiments, three walls of the frame 70 may surround three sides of a first post 94 and three walls of the frame 70 can surround three sides of a second post 94. In some embodiments, two walls and at least one guide support 100 (FIGS. 3 and 8) can surround three sides of the second post 94. In some embodiments, each of the posts 94 are surrounded on at least three sides by the surfaces of the frame 70 prior engagement of the engagement portions 92 to align and guide the hinge assembly 38 over the posts 94 and provide alignment of the engagement portions 92 to the posts engagement portions 96.

The hinge assembly 38 and facepack 34 can be decoupled from the base portion 14, via disengagement of the engagement portions 92 from the hinge post engagement portions 96. This disengagement can be accomplished, for example, by transition of the tabs 72 toward each other. This transition can be accomplished via one hand, without use of tools. Movement of the tabs 72 toward each other can move the engagement portions 92 against the biasing force of the biasing portions 98.

FIGS. 12-25 illustrate various embodiments of facepacks. Various attributes of the facepacks are shown in broken lines to illustrate that they may or may not be present and that their position, orientation, shape, style, number, etc. can be different according to the different embodiments. The broken lines form no part of the designs. For example, FIGS. 12-18 show facepacks with all or more of the back side in broken lines. The back side is shown in broken lines to indicate that the back side can comprise various components, shapes, thicknesses, cavities, protrusions, according to different embodiments. FIGS. 19-25 show facepacks with a front display and hinge portion in broken lines. The front display is in broken lines to indicate that the front display may or may not be present and the position, orientation, depth, shape, etc. of the front display may differ according to different embodiments. The hinge portion is in broken lines to indicate that the hinge portion may or may not be present and the position, orientation, depth, width, height, shape, etc. of the hinge portion may differ according to different embodiments. Dot-dot-dash lines are used to illustrate boundary lines and form no part of the claimed designs.

For expository purposes, the term "horizontal" as used herein is defined as a plane parallel to the plane or surface of the floor of the area in which the system being described is used or the method being described is performed, regardless of its orientation. The term "floor" can be interchanged with the term "ground." The term "vertical" refers to a direction perpendicular to the horizontal as just defined. Terms such as "above," "below," "bottom," "top," "side," "higher," "lower," "upper," "over," and "under," are defined with respect to the horizontal plane.

As used herein, the terms "attached," "connected," "mated," and other such relational terms should be construed, unless otherwise noted, to include removable, moveable, fixed, adjustable, and/or releasable connections or attachments. The connections/attachments can include direct connections and/or connections having intermediate structure between the two components discussed.

The terms "approximately", "about", "generally" and "substantially" as used herein represent an amount close to the stated amount that still performs a desired function or achieves a desired result. For example, the terms "approximately", "about", "generally," and "substantially" may refer to an amount that is within less than 10% of the stated amount.

While the preferred embodiments of the present inventions have been described above, it should be understood that they have been presented by way of example only, and not of limitation. It will be apparent to persons skilled in the relevant art that various changes in form and detail can be made therein without departing from the spirit and scope of the inventions. Thus, the present inventions should not be limited by the above-described exemplary embodiments, but should be defined only in accordance with the following claims and their equivalents. Furthermore, while certain advantages of the inventions have been described herein, it is to be understood that not necessarily all such advantages may be achieved in accordance with any particular embodiment of the inventions. Thus, for example, those skilled in the art will recognize that the inventions may be embodied or carried out in a manner that achieves or optimizes one advantage or group of advantages as taught herein without necessarily achieving other advantages as may be taught or suggested herein.

What is claimed is:

1. An irrigation control box comprising:
   a housing base having:
   a first sidewall;
   a second sidewall;
   a top sidewall, extending between the first and second sidewalls;
   a bottom sidewall extending between the first and second sidewalls opposite the top sidewall;
   a back wall connected to one or more of the first, second, top, and bottom sidewalls;
   a housing interior defined by the first, second, top, and bottom sidewalls; and at least one hinge post connected to and extending away from the back wall;
an offset hinge assembly having:
a hinge assembly frame comprising a plurality of walls that define a hinge assembly interior;
a first attachment structure comprising at least one engagement feature and at least one biasing portion that biases the at least one engagement feature for engagement with a hinge post engaging portion of the at least one hinge post, the first attachment structure positioned at least partially within the hinge assembly interior to releasably attach to the at least one hinge post; and
a rotational attachment point comprising a plurality of hinge mating features; and
a facepack comprising a plurality of facepack mating features that mate with the plurality of hinge mating features, respectively;
wherein the facepack rotates about the plurality of hinge mating features with respect to the housing base when the housing base and facepack are each attached to the offset hinge assembly.

2. The irrigation control box of claim 1, wherein the first attachment structure deflects toward the at least one biasing portion and against a biasing force of the at least one biasing portion as the at least one hinge post is releasably attached to the first attachment structure.

3. The irrigation control box of claim 1, wherein the at least one biasing portion is a leaf spring.

4. The irrigation control box of claim 1, wherein the at least one biasing portion is formed as an integral part with the first attachment structure.

5. The irrigation control box of claim 1, further comprising a fixed transverse wall positioned at least partially within the hinge assembly frame and extending oblique or perpendicular to a direction in which the at least one biasing portion biases the at least one engagement feature of the first attachment structure.

6. The irrigation control box of claim 5, wherein the at least one biasing portions contacts the fixed transverse wall.

7. The irrigation control box of claim 1, wherein the housing base further comprises a second hinge post wherein the offset hinge assembly further includes a second attachment structure positioned at least partially within the hinge assembly interior, the second attachment structure including a second engagement feature and a second biasing portion that biases the second engagement feature for engagement with the second hinge post.

8. The irrigation control box of claim 1, wherein the first attachment structure moves between a first position and a second position along a length of the hinge assembly frame.

9. The irrigation control box of claim 1, wherein the first attachment structure is removably connected to the hinge assembly frame.

10. The irrigation control box of claim 9, wherein the first attachment structure includes an elongate track and the hinge assembly frame includes a post, wherein the post is positioned at least partially within the elongate track when the first attachment structure and the hinge assembly frame are assembled.

11. The irrigation control box of claim 10, wherein a biasing force is applied in a direction parallel to a length of the elongate track.

12. The irrigation control box of claim 1, wherein the offset hinge assembly is rotationally, translationally, and releasably fixed to the housing base when the at least one engagement feature is releasably attached to the hinge post engaging portion of the at least one hinge post of the housing base.

13. A method of assembling and disassembling an irrigation control box, the method comprising:
providing a housing base having a first sidewall, a second sidewall, a top sidewall extending between the first and second sidewalls, a bottom sidewall extending between the first and second sidewalls opposite the top wall, a back wall connected to one or more of the first, second, top, and bottom sidewalls, a housing interior defined by the first, second, top, and bottom sidewalls, and at least one hinge post connected to and extending away from the back wall;
providing a facepack having a plurality of facepack mating features;
providing an offset hinge assembly having a hinge assembly frame comprising a plurality of walls that define a hinge assembly interior, a first attachment structure comprising at least one engagement feature and at least one biasing portion that biases the at least one engagement feature for engagement with a hinge post engaging portion of the at least one hinge post, and a rotational attachment point comprising a plurality of hinge mating features that mate with the plurality of facepack mating features, respectively, the first attachment structure positioned at least partially within the hinge assembly interior to releasably attach to the at least one hinge post;
connecting the plurality of hinge mating features of the offset hinge assembly to the plurality of facepack mating features of the facepack, respectively;
releasably connecting the first attachment structure of the offset hinge assembly to the at least one hinge post such that a point of attachment between the first attachment structure and the at least one hinge post is closer to the housing base than a hinge attachment point between the plurality of hinge mating features of the offset hinge assembly and the plurality of facepack mating features of the facepack; and
without use of tools, disconnecting the first attachment structure of the offset hinge assembly from the at least one hinge post.

14. The method of claim 13, wherein disconnecting the first attachment structure of the offset hinge assembly from the at least one hinge post comprises translating a tab of the offset hinge assembly from a connected position to a disconnected position.

15. The method of claim 13, wherein releasably connecting the first attachment structure of the offset hinge assembly to the at least one hinge post comprises deflecting the first attachment structure toward the at least one biasing portion and against a biasing force of the at least one biasing portion.

16. The method of claim 13, wherein the at least one biasing portion is a leaf spring.

17. The method of claim 13, wherein the at least one biasing portion is formed as an integral part with the first attachment structure.

18. The method of claim 13, wherein the irrigation control box further comprises a fixed transverse wall positioned at least partially within the hinge assembly frame and extending oblique or perpendicular to a direction in which the at least one biasing portion biases the at least one engagement feature of the first attachment structure.

* * * * *

UNITED STATES PATENT AND TRADEMARK OFFICE
CERTIFICATE OF CORRECTION

PATENT NO. : 10,069,284 B1
APPLICATION NO. : 15/663505
DATED : September 4, 2018
INVENTOR(S) : Michael F. Paul Page 1 of 1

It is certified that error appears in the above-identified patent and that said Letters Patent is hereby corrected as shown below:

In the Claims

In Column 11, Line 40, Claim 6, change "portions" to --portion--.

In Column 11, Line 42, Claim 7, change "post" to --post,--.

Signed and Sealed this
Eleventh Day of December, 2018

Andrei Iancu
*Director of the United States Patent and Trademark Office*